(12) United States Patent
Chyi et al.

(10) Patent No.: US 9,070,708 B2
(45) Date of Patent: Jun. 30, 2015

(54) SEMICONDUCTOR DEVICE AND MANUFACTURING METHOD THEREOF

(71) Applicants: National Central University, Taoyuan County (TW); DELTA ELECTRONICS, INC., Taoyuan Hsien (TW)

(72) Inventors: Jen-Inn Chyi, Taoyuan County (TW); Geng-Yen Lee, Taoyuan County (TW); Wei-Kai Shen, Taoyuan County (TW); Ching-Chuan Shiue, Taoyuan Hsien (TW); Tai-Kang Shing, Taoyuan County (TW)

(73) Assignees: NATIONAL CENTRAL UNIVERSITY, Taoyuan (TW); DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 14/164,279

(22) Filed: Jan. 27, 2014

(65) Prior Publication Data
US 2014/0264450 A1    Sep. 18, 2014

Related U.S. Application Data

(60) Provisional application No. 61/779,134, filed on Mar. 13, 2013.

(51) Int. Cl.
| | |
|---|---|
| H01L 29/66 | (2006.01) |
| H01L 21/338 | (2006.01) |
| H01L 21/20 | (2006.01) |
| H01L 29/778 | (2006.01) |
| H01L 29/423 | (2006.01) |
| H01L 29/04 | (2006.01) |
| H01L 29/06 | (2006.01) |
| H01L 29/20 | (2006.01) |

(52) U.S. Cl.
CPC ....... H01L 29/66462 (2013.01); *H01L 29/4236* (2013.01); H01L 29/7786 (2013.01); *H01L 29/045* (2013.01); *H01L 29/0649* (2013.01); *H01L 29/0657* (2013.01); *H01L 29/2003* (2013.01)

(58) Field of Classification Search
CPC ............ H01L 29/0692; H01L 29/1029; H01L 29/7789
USPC .......... 257/192, 194, E29.262, E29.253, 410; 438/478
See application file for complete search history.

(56) References Cited

U.S. PATENT DOCUMENTS 5,473,176 A * 12/1995 Kakumoto ..................... 257/192
5,929,467 A *  7/1999 Kawai et al. .................. 257/192

(Continued)

*Primary Examiner* — Long K Tran
*Assistant Examiner* — Dzung Tran
(74) *Attorney, Agent, or Firm* — CKC & Partners Co., Ltd.

(57) ABSTRACT

A semiconductor device including a substrate, a heterojunction body, a passivation layer, a source contact, a drain contact, and a gate contact. The heterojunction body disposed on or above the substrate includes a first semiconductor layer, a mask layer, a regrowth layer, and a second semiconductor layer. The first semiconductor layer is disposed on or above the substrate. The mask layer is disposed on or above a portion of the first semiconductor layer. The regrowth layer disposed on the first semiconductor layer and adjacent to the mask layer includes a main portion and at least one inclined portion. The second semiconductor layer is disposed on the mask layer and the regrowth layer. The passivation layer is disposed on the second semiconductor layer. The gate contact is disposed on the passivation layer, between the source contact and the drain contact, and at least above the inclined portion of the regrowth layer.

11 Claims, 9 Drawing Sheets

(56) References Cited

U.S. PATENT DOCUMENTS

| | | |
|---|---|---|
| 7,417,267 B2 | 8/2008 | Beach |
| 2005/0023555 A1* | 2/2005 | Yoshida et al. ............... 257/192 |
| 2009/0057720 A1* | 3/2009 | Kaneko ......................... 257/194 |
| 2011/0303952 A1* | 12/2011 | Hwang et al. ................. 257/194 |

* cited by examiner

SEMICONDUCTOR DEVICE AND MANUFACTURING METHOD THEREOF

RELATED APPLICATIONS

This application claims priority to US Provisional Patent Application Ser. No. 61/779,134, filed Mar. 13, 2013, which is herein incorporated by reference.

BACKGROUND

1. Technical Field

The present disclosure relates to a semiconductor device.

2. Description of Related Art

As a form of a field effect transistor (FET), a high electron mobility transistor (HEMT) is widely used in the art because of its high electron mobility and low resistance. The key element within the HEMT is a heterojunction formed by two materials with different band gaps instead of a pn-junction used in the conventional FET. A commonly used material combination of the two materials of the heterojunction is AlGaN and GaN. Since the heterojunction created by AlGaN and GaN forms a quantum well in the conduction band on the GaN side, a two-dimensional electron gap (2DEG) appears at the interface of AlGaN and GaN.

An enhancement-mode FET (e.g. HEMT), which is normally off at zero gate-source voltage, is a switching element in a logic circuit. Conventional methods for manufacturing an enhancement-mode AlGaN/GaN HEMT include: (1) employing a thin AlGaN layer, (2) performing a gate-recess process, (3) using fluoride-based plasma treatment, (4) using oxygen plasma treatment, (5) employing a pn-junction gate, (6) employing a metal-insulator-semiconductor gate structure, and (7) employing an annealed Pt-based gate metal. However, the aforementioned methods have drawbacks of the threshold voltage being not easy to control and not spatially uniform, and/or damages may occur during surface processing in the manufacturing.

SUMMARY

An aspect of the invention provides a semiconductor device including a substrate, a heterojunction body, a passivation layer, a source contact, a drain contact, and a gate contact. The heterojunction body is disposed on or above the substrate, and the heterojunction body includes a first semiconductor layer, a mask layer, a regrowth layer, and a second semiconductor layer. The first semiconductor layer is disposed on or above the substrate. The mask layer is disposed on or above a portion of the first semiconductor layer. The regrowth layer is disposed on the first semiconductor layer and adjacent to the mask layer. The regrowth layer includes a main portion and at least one inclined portion. Each of the main portion and the inclined portion has a top surface. The mask layer has a bottom surface facing the first semiconductor layer. The top surface of the main portion and the bottom surface of the mask layer are non-coplanar, and the top surface of the inclined portion slopes at an angle between the top surface of the main portion and the bottom surface of the mask layer. The second semiconductor layer is disposed on the mask layer and the regrowth layer. The passivation layer is disposed on the second semiconductor layer and at least above the mask layer and the inclined portion of the regrowth layer. The source contact and the drain contact are respectively electrically coupled with the heterojunction body. The gate contact is disposed on the passivation layer, between the source contact and the drain contact, and at least above the inclined portion of the regrowth layer.

In one or more embodiments, the mask layer is disposed between two of the regrowth layers, and the second semiconductor layer has at least two through holes. Each of the regrowth layers has at least one portion exposed by one of the through holes of the second semiconductor layer. The source contact and the drain contact are respectively disposed on the portions of the to regrowth layers exposed by the through holes of the second semiconductor layer.

In one or more embodiments, the mask layer has a width less than about 2 μm.

In one or more embodiments, the heterojunction body further includes a third semiconductor layer disposed between the mask layer and the first semiconductor layer. The first semiconductor layer has two recesses, and portions of the regrowth layers are disposed in the recesses, respectively.

In one or more embodiments, the heterojunction body further includes a third semiconductor layer disposed between the mask layer and the first semiconductor layer. The first semiconductor layer has at least a recess, and a portion of the regrowth layer is disposed in the recess.

In one or more embodiments, the second semiconductor layer has at least one through hole exposing at least one portion of the regrowth layer, and the third semiconductor layer has at least one through hole and the mask layer has at least one through hole together exposing at least one portion of the first semiconductor layer. One of the source contact and the drain contact is disposed on the portion of the first semiconductor layer exposed by the through hole of the third semiconductor layer, and the other one of the source contact and the drain contact is disposed on the portion of the regrowth layer exposed by the through hole of the second semiconductor layer.

In one or more embodiments, a material of the second semiconductor layer is the same as a material of the third semiconductor layer.

In one or more embodiments, the semiconductor device further includes a buffer layer disposed between the substrate and the heterojunction body.

In one or more embodiments, the mask layer is made of oxide, nitride, or any combination thereof.

In one or more embodiments, the angle between the top surface of the inclined portion and the bottom surface of the mask layer is about 60 degrees.

In one or more embodiments, a material of the regrowth layer is the same as a material of the first semiconductor layer.

Another aspect of the invention provides a method for manufacturing a semiconductor device, including the following steps of: (The acts are not recited in the sequence in which the acts are performed. That is, unless the sequence of the acts is expressly indicated, the sequence of the acts is interchangeable, and all or part of the acts may be simultaneously, partially simultaneously, or sequentially performed.)

(1) providing a substrate.

(2) forming a heterojunction body on or above the substrate, wherein forming the heterojunction body includes the following steps:

(2.1) forming a first semiconductor layer on or above the substrate.

(2.2) forming a mask layer on or above a portion of the first semiconductor layer.

(2.3) forming at least one regrowth layer adjacent to the mask layer, wherein the regrowth layer includes a main portion and at least one inclined portion.

(2.4) forming a second semiconductor layer on the regrowth layer and the mask layer.

(3) forming a passivation layer on the second semiconductor layer and at least above the mask layer and the inclined portion of the regrowth layer.

(4) forming a source contact and a drain contact respectively electrically coupled with the heterojunction body.

(5) forming a gate electrode on the passivation layer, between the source contact and the drain contact, and at least above the inclined portion of the regrowth layer.

In one or more embodiments, the step of (2.3) includes:
(2.3.1) forming two of the regrowth layers at the opposite sides of the mask layer.

the method further includes step:
(6) forming two through holes in the second semiconductor layer, such that at least one portion of each of the regrowth layers is exposed by one of the through holes of the second semiconductor layer.

and the step of (4) includes:
(4.1) forming the source electrode and the drain electrode respectively on the portions of the regrowth layers exposed by the through holes, respectively.

In one or more embodiments, the method further includes the following steps:
(7) forming a third semiconductor layer between the first semiconductor layer and the mask layer.
(8) forming at least one recess in the first semiconductor layer.

and the step of (2.3) includes:
(2.3.2) forming at least a portion of the regrowth layer in the recess.

In one or more embodiments, the step of (8) includes:
(8.1) forming two of the recesses at two opposite sides of the mask layer.

the step of (2.3) further includes:
(2.3.3) forming at least two portions of the regrowth layers in the recesses, respectively.

and the step of (4) includes:
(4.2) forming the source electrode and the drain electrode respectively on the portions of the regrowth layers, respectively.

In one or more embodiments, the step of (4) includes:
(4.3) forming one of the source contact and the drain electrode on the first semiconductor layer.
(4.4) forming the other one of the source contact and the drain electrode on the regrowth layer.

In one or more embodiments, a material of the second semiconductor layer is the same as a material of the third semiconductor layer.

In one or more embodiments, the method further includes:
(9) forming a buffer layer between the substrate and the heterojunction layer.

In one or more embodiments, the mask layer is made of oxide, nitride, or any combination thereof.

In one or more embodiments, a material of the regrowth layer is a same as the material of the first semiconductor layer.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

Chemical elements referred in this article are represented by chemical symbols for convenience. That is, aluminum is represented by Al, indium is represented by In, gallium is represented by Ga, nitrogen is represented by N, silicone is represented by Si, carbon is represented by C, oxygen is represented by O, titanium is represented by Ti, nickel is represented by Ni, and gold is represented by Au.

The First Embodiment

Figure 1A:
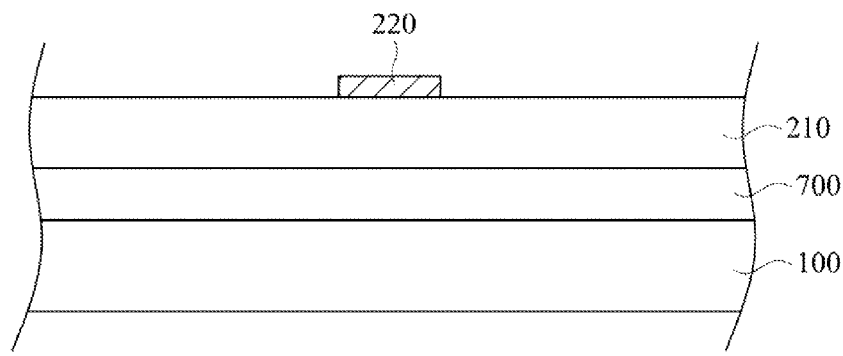
FIG. 1A to FIG. 1E are cross-sectional views of a method for to manufacturing a semiconductor device according to a first embodiment of the present invention.

FIG. 1A to FIG. 1E are cross-sectional views of a method for manufacturing a semiconductor device according to the first embodiment of the present invention. As shown in FIG. 1A, a manufacturer may provide a substrate 100 first. Subsequently, the manufacturer may optionally form a buffer layer 700 on the substrate 100. In this embodiment, the substrate 100 may be made of sapphire, Si, SiC, or GaN, and the buffer layer 700 may be made of AlN or other suitable materials.

Then, the manufacturer may form a heterojunction body 200 (see FIG. 1C) on or above the substrate 100. In greater detail, the manufacturer may form a first semiconductor layer 210 on or above the substrate 100 first. For example, in FIG. 1A, the first semiconductor layer 210 is formed above the substrate 100 and on the buffer layer 700. Subsequently, the manufacturer may form a mask layer 220 on a portion of the first semiconductor layer 210. For example, the manufacturer may first form the mask layer covering overall the surface of the first semiconductor layer 210, and then remove a portion of the mask layer by photolithography and etching processes to form the mask layer 220 on the first semiconductor layer 210. In this embodiment, the first semiconductor layer 210 may be made of GaN, and the mask layer 220 may be made of oxide, nitride, or any combination thereof, such as $SiO_2$.

Figure 1B:
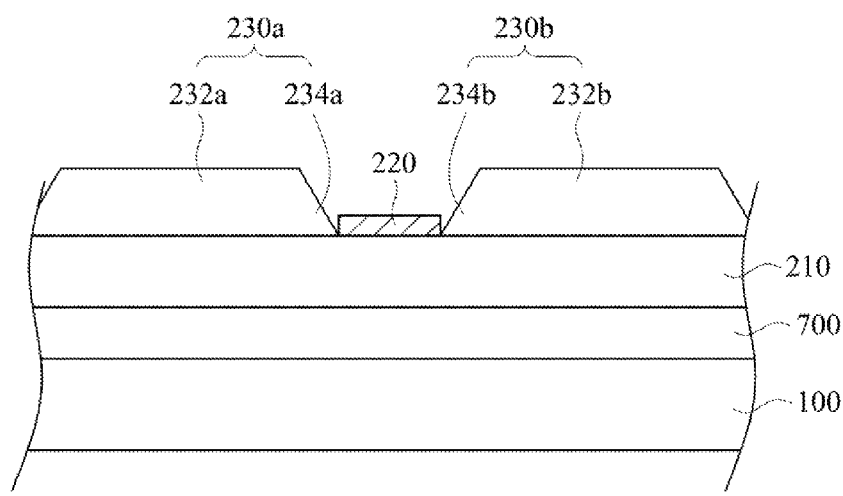

Reference is made to FIG. 1B. The manufacturer may form at least one regrowth layer adjacent to the mask layer 220. For example, as shown in FIG. 1B, the manufacturer may form two of the regrowth layers 230a and 230b at the opposite sides of the mask layer 220. The regrowth layer 230a (230b) includes a main portion 232a (232b) and at least one inclined portion 234a (234b). The regrowth layers 230a and 230b may be formed using the epi-growth and high temperature annealing process. After the annealing process, the inclined to portions 234a and 234b of the regrowth layers 230a and 230b can be more precisely formed adjacent to the mask layer 220, respectively, since there can be no lateral overgrowth of the regrowth layers 230a and 230b during the annealing process. In this embodiment, the material of the regrowth layers 230a and 230b may be the same as the material of the first semiconductor layer 210, which means the regrowth layers 230a and 230b may be also made of GaN.

Figure 1C:
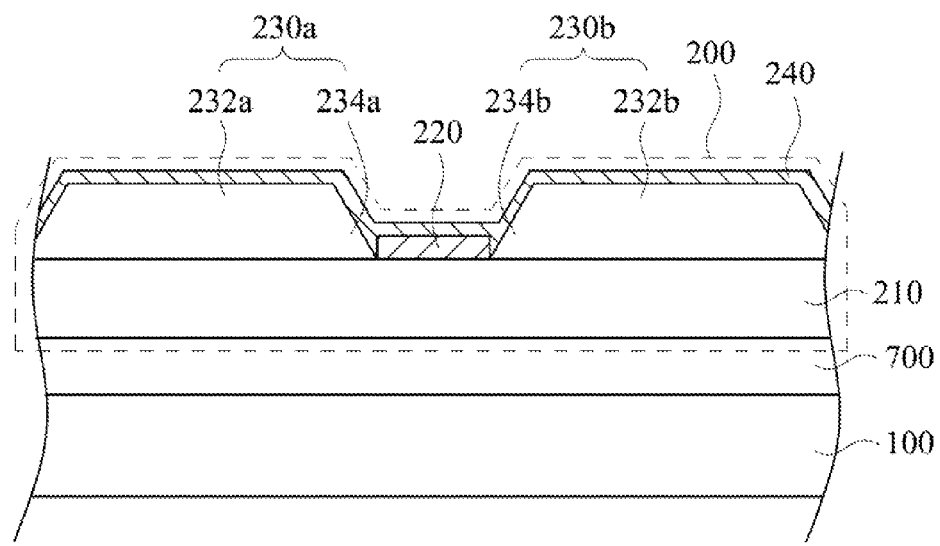

Reference is made to FIG. 1C. The manufacturer then can form a second semiconductor layer 240 on the regrowth layers 230a and 230b and the mask layer 220. As such, the step of forming the heterojunction body 200 is completed. In this embodiment, the second semiconductor layer 240 may be made of AlGaN, and the second semiconductor layer 240 may be formed by epi-growth process.

Figure 1D:
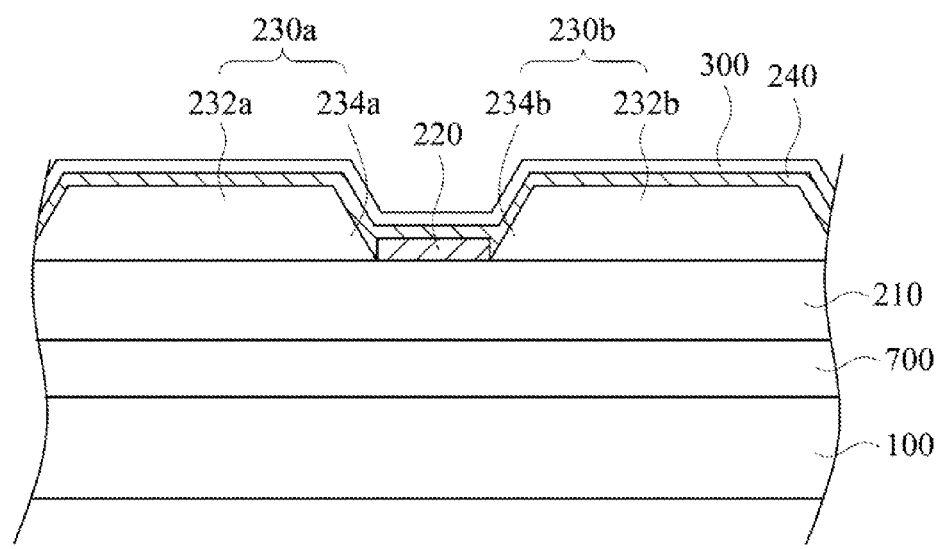

Reference is made to FIG. 1D. The manufacturer may form a passivation layer 300 on the second semiconductor layer 240, and at least above the mask layer 220 and the inclined portions 234a and 234b of the regrowth layers 230a and 230b. In this embodiment, the passivation layer 300 may be made of $Al_2O_3$, $SiN_x$, $SiO_2$, or any combination thereof.

Figure 1E:
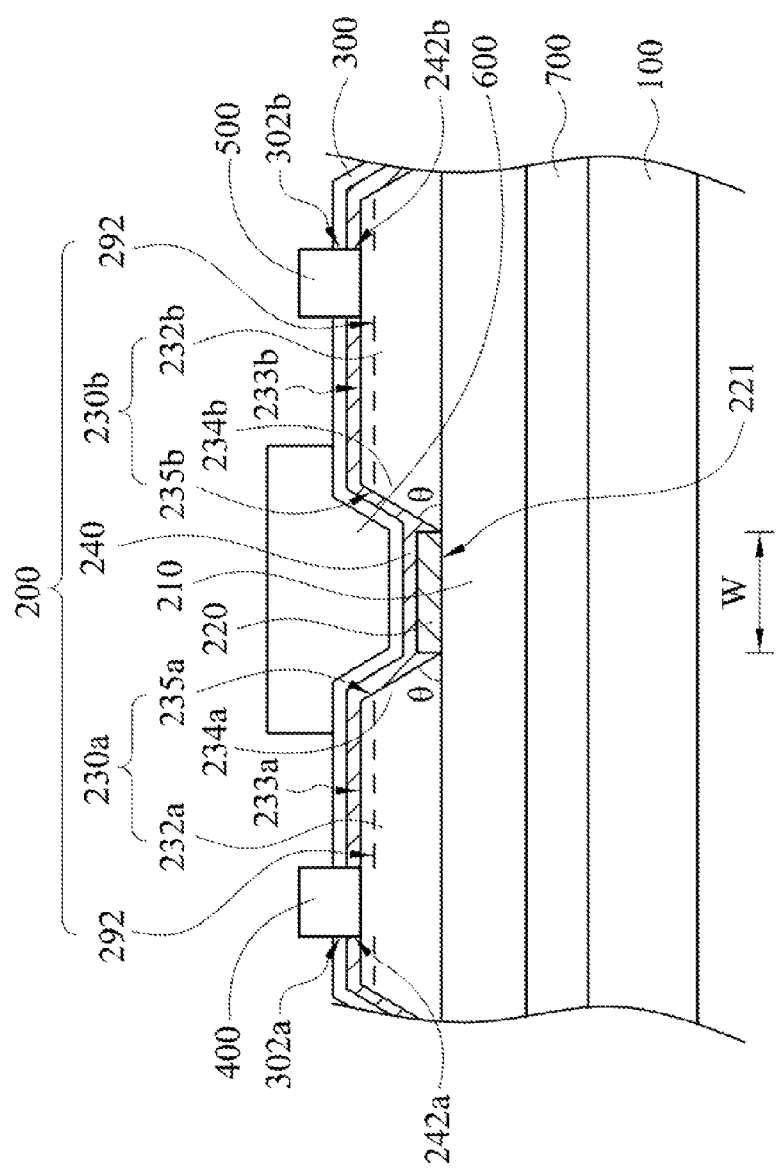

Reference is made to FIG. 1E. Subsequently, the manufacturer may form a source contact 400 and a drain contact 500 respectively electrically coupled with the heterojunction body 200. For example, as shown in FIG. 1E, the manufacturer can first form through holes 242a and 242b in the second semiconductor layer 240, such that at least one portion of the regrowth layer 230a is exposed by the through hole 242a of the second semiconductor layer 240, and at least one portion of the regrowth layer 230b is exposed by the through hole 242b of the second semiconductor layer 240. Furthermore, if the passivation layer 300 covers overall the second semiconductor layer 240, the manufacturer may also form two through holes 302a and 302b in the passivation layer 300, where the through hole 302a and 242a together expose the portion of the regrowth layer 230a, and the through holes 302b and 242b together expose the portion of the regrowth layer 230b. Subsequently, the manufacturer may form the source contact 400 in the through holes 242a and 302a, and form the drain contact 500 in the through holes 242b and 302b. In this embodiment, the source contact 400 and the drain contact 500 may be made of metal, for example Ti, Al, Ni, Au or any combination thereof.

Subsequently, the manufacturer then may form a gate electrode 600 on the passivation layer 300, between the source contact 400 and the drain contact 500, and at least above the inclined portions 234a and 234b of the regrowth layers 230a and 230b. Consequently, the semiconductor device is completed. In this embodiment, the gate contact 600 may be made of metal, for example Ti, Al, Ni, Au or any combination thereof.

Structurally, the semiconductor device includes the substrate 100, the heterojunction body 200, the passivation layer 300, the source contact 400, the drain contact 500, and the gate contact 600. The heterojunction body 200 is disposed on or above the substrate 100, and the heterojunction body 200 includes the first semiconductor layer 210, the mask layer 220, the regrowth layers 230a and 230b, and the second semiconductor layer 240. The first semiconductor layer 210 is disposed on or above the substrate 100. The mask layer 220 is disposed on or above the portion of the first semiconductor layer 210. The regrowth layers 230a and 230b are disposed on the first semiconductor layer 210 and adjacent to the mask layer 220, respectively. The regrowth layer 230a (230b) includes the main portion 232a (232b) and the inclined portion 234a (234b). The main portion 232a (232b) has a top surface 233a (233b), and the inclined portion 234a (234b) has a top surface 235a (235b). The mask layer 220 has a bottom surface 221 facing the first semiconductor layer 210. The top surface 233a (233b) of the main portion 232a (232b) and the bottom surface 221 of the mask layer 220 are non-coplanar, and the top surface 235a (235b) of the inclined portion 234a (234b) slopes at an angle $\theta$ between the top surface 233a (233b) of the main portion 232a (232b) and the bottom surface 221 of the mask layer 220. The second semiconductor layer 240 is disposed on the mask layer 220 and the regrowth layers 230a and 230b. The passivation layer 300 is disposed on the second semiconductor layer 240 and at least above the mask layer 220 and the inclined portions 234a and 234b of the regrowth layers 230a and 230b. The source contact 400 and the drain contact 500 are respectively electrically coupled with the heterojunction body 200. The gate contact 600 is disposed on the passivation layer 300, between the source contact 400 and the drain contact 500, and at least above the inclined portions 234a and 234b of the regrowth layers 230a and 230b. Furthermore, in one or more embodiments, the semiconductor device can further include the buffer layer 700 disposed between the substrate 100 and the heterojunction body 200.

In this embodiment, the second semiconductor layer 240 made of AlGaN and each of the regrowth layers 230a and 230b made of GaN are paired to be a heterostructure, respectively. Therefore, a two-dimensional electron gas (2DEG) 292 appears within the heterojunction body 200 and in the main portions 232a and 232b of the regrowth layers 230a and 230b. However, since the to 2DEG concentration in the inclined portions 234a and 234b of the regrowth layer 230a and 230b are reduced effectively due to the crystal orientations of the second semiconductor layer 240 and each of the regrowth layers 230a and 230b, the 2DEGs 292 are substantially interrupted at the inclined portion 234a and 234b of the regrowth layer 230a and 230b that is below the gate contact 600. Also, a portion of the first semiconductor layer 210 beneath the mask layer 220 lacks of the 2DEG, therefore the semiconductor device is normally OFF. Through the application of an appropriate threshold voltage to the gate contact 600, not only 2DEGs can be restored within the inclined portions 234a and 234b of the regrowth layers 230a and 230b, but a channel layer can be restored in the portion of the first semiconductor layer 210 beneath the mask layer 220, rendering the semiconductor device being ON.

In one or more embodiments, the mask layer 220 has a width W less than about 2 μm. Since the width W is corresponding to the length of the channel layer in the first semiconductor layer 210, the semiconductor device can be turned ON more efficiently when the width W is less than about 2 μm.

In one or more embodiments, the angle $\theta$ between the top surface 235a (235b) of the inclined portion 234a (234b) and the bottom surface 221 of the mask layer 220 can be used to control the threshold voltage of the semiconductor device. More specifically, the electron concentrations of the 2DEG within the inclined portions 234a and 234b of the regrowth layers 230a and 230b decrease as the angle $\delta$ approaches 90 degrees. That is, the threshold voltage of the semiconductor device increases as the angle $\theta$ approaches 90 degrees. As such, in one or more embodiments, the angle $\theta$ can be about 60 degrees.

In summary, the regrowth layers 230a and 230b are both formed by the epi-growth process rather than the etching process. Therefore, the surface damage caused by the etching process does not exist in the regrowth layers 230a and 230b, resulting a good quality semiconductor device. Moreover, for the regrowth layers 230a and 230b made of GaN, the angle $\delta$ formed in the epi-growth process is about 60 degrees, resulting a ready-made inclined surface (i.e. the top surface 235a or 235b) which needs no additional inclined surface formation process. In other word, in the step of forming the regrowth layers 230a and 230b not only can prevent the etching damage, but can directly form the inclined portions 234a and 234b.

The Second Embodiment

Figure 2A:
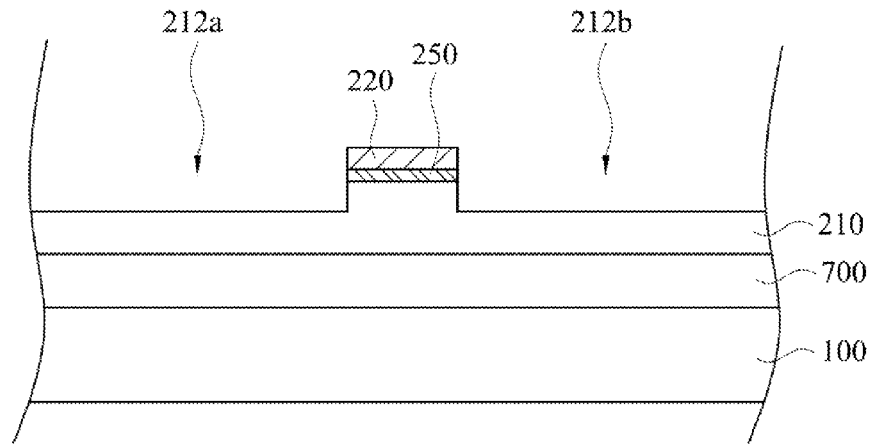
FIG. 2A to FIG. 2E are cross-sectional views of a method for manufacturing the semiconductor device according to a second embodiment of the present invention.

FIG. 2A to FIG. 2E are cross-sectional views of a method for manufacturing the semiconductor device according to the second embodiment of the present invention. As shown in FIG. 2A, a manufacturer may provide a substrate 100 first. Subsequently, the manufacturer may optionally form a buffer layer 700 on the substrate 100. In this embodiment, the substrate 100 may be made of sapphire, Si, SiC, or GaN, and the buffer layer 700 may be made of AlN or other suitable materials.

Then, the manufacturer may form a heterojunction body 200 (see FIG. 2C) on or above the substrate 100. In greater detail, the manufacturer may form a first semiconductor layer 210 on or above the substrate 100 first. For example, in FIG. 2A, the first semiconductor layer 210 is formed above the substrate 100 and on the buffer layer 700. Subsequently, the manufacturer may form a third semiconductor layer 250 on a portion of the first semiconductor layer 210, and then form a mask layer 220 on the third semiconductor layer 250. For example, the manufacturer may form the third semiconductor layer and the mask layer covering overall the surface of the first semiconductor layer 210 in sequence, and then remove two portions of the mask layer, two portions of the third semiconductor layer, and two portions of the first semiconductor layer 210 together by photolithography and etching processes to form the third semiconductor layer 250 on the first semiconductor layer 210, the mask layer 220 on the third semiconductor layer 250, and two recesses 212a and 212b in the first semiconductor layer 210. In this embodiment, the first semiconductor layer 210 may be made of GaN, the third semiconductor layer 250 may be made of AlGaN, and the mask layer 220 may be made of oxide, nitride, or any combination thereof, such as $SiO_2$.

Figure 2B:
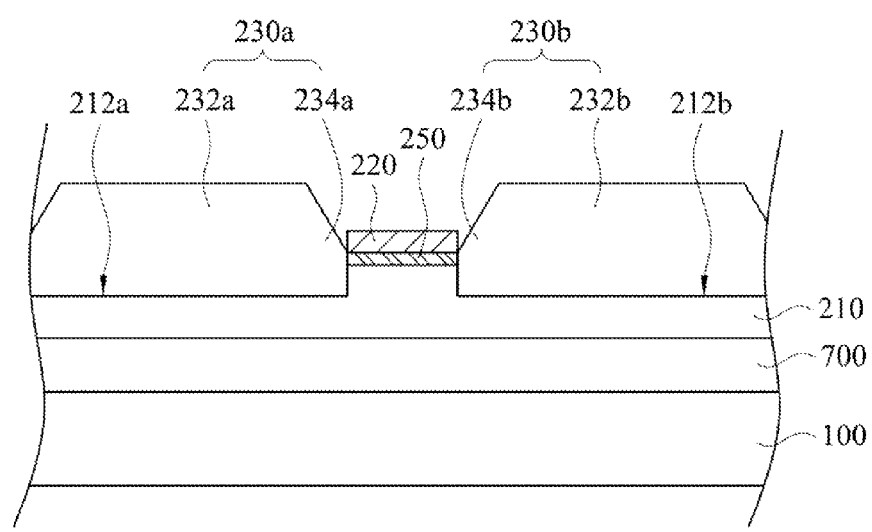

Reference is made to FIG. 2B. The manufacturer may form two regrowth layers 230a and 230b at the opposite sides of the mask layer 220, where at least a portion of the regrowth layer 230a is disposed in the recess 212a, and at least a portion of the regrowth layer 230b is disposed in the recess 212b. The regrowth layer 230a (230b) includes a main portion 232a (232b) and at least one inclined portion 234a (234b). The regrowth layers 230a and 230b may be formed using the epi-growth and high temperature annealing process. After the annealing process, the inclined portions 234a and 234b of the regrowth layers 230a and 230b can be more precisely formed adjacent to the mask layer 220, respectively, since there can be no lateral overgrowth of the regrowth layers 230a and 230b during the annealing process. In this embodiment, the material of the regrowth layers 230a and 230b may be the same as the material of the first semiconductor layer 210, which means the regrowth layers 230a and 230b may be also made of GaN.

Figure 2C:
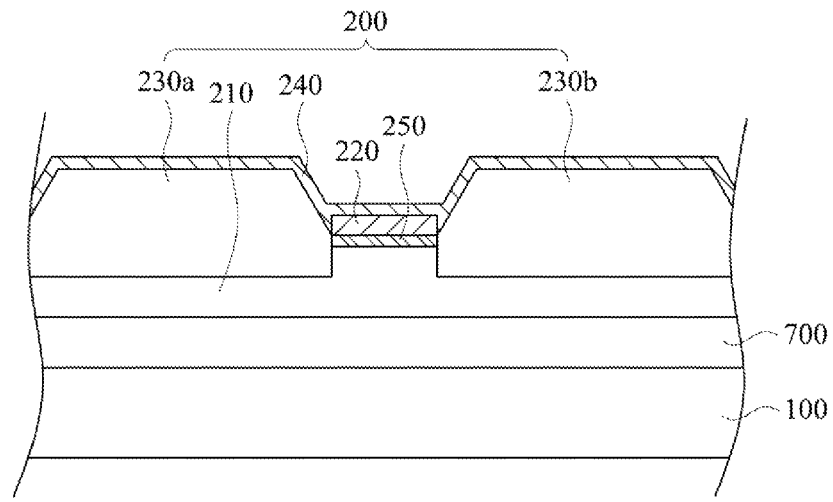

Reference is made to FIG. 2C. The manufacturer then can form a second semiconductor layer 240 on the regrowth layers 230a and 230b and the mask layer 220. As such, the step of forming the heterojunction body 200 is completed. In this embodiment, the material of the second semiconductor layer 240 can be the same as the material of the third semiconductor layer 250, which means the second semiconductor layer 240 may be made of AlGaN, and the second semiconductor layer 240 may be formed by epi-growth process.

Figure 2D:
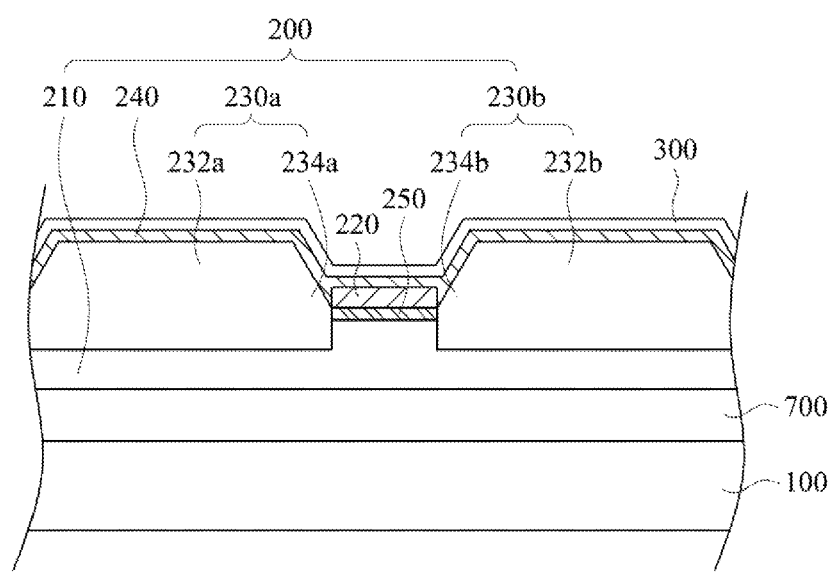

Reference is made to FIG. 2D. The manufacturer may form a passivation layer 300 on the second semiconductor layer 240, and at least above the mask layer 220 and the inclined portions 234a and 234b of the regrowth layers 230a and 230b. In this embodiment, the passivation layer 300 may be made of $Al_2O_3$, $SiN_x$, $SiO_2$, or any combination thereof.

Figure 2E:
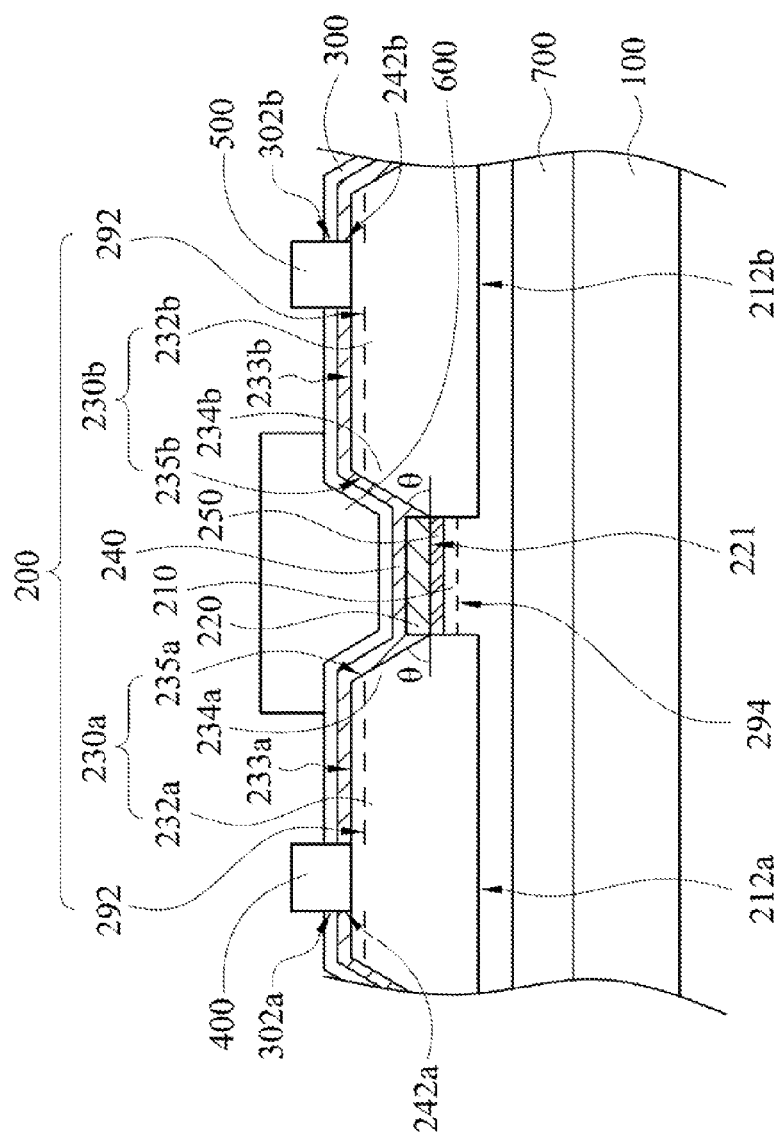

Reference is made to FIG. 2E. Subsequently, the manufacturer may form a source contact 400 and a drain contact 500 respectively electrically coupled with the heterojunction body 200. For example, as shown in FIG. 2E, the manufacturer can first form through holes 242a and 242b in the second semiconductor layer 240, such that at least one portion of the regrowth layer 230a is exposed by the through hole 242a of the second semiconductor layer 240, and at least one portion of the regrowth layer 230b is exposed by the through hole 242b of the second semiconductor layer 240. Furthermore, if the passivation layer 300 covers overall the second semiconductor layer 240, the manufacturer may also form two through holes 302a and 302b in the passivation layer 300, where the through hole 302a and 242a together expose the portion of the regrowth layer 230a, and the through holes 302b and 242b together expose the portion of the regrowth layer 230b. Subsequently, the manufacturer may form the source contact 400 in the through holes 242a and 302a, and form the drain contact 500 in the through holes 242b and 302b. In this embodiment, the source contact 400 and the drain contact 500 may be made of metal, for example Ti, Al, Ni, Au or any combination thereof.

Subsequently, the manufacturer then may form a gate electrode 600 on the passivation layer 300, between the source contact 400 and the drain contact 500, and at least above the inclined portions 234a and 234b of the regrowth layers 230a and 230b. Consequently, the semiconductor device is completed. In this embodiment, the gate contact 600 may be made of metal, for example Ti, Al, Ni, Au or any combination thereof.

Structurally, the semiconductor device includes the substrate 100, the heterojunction body 200, the passivation layer 300, the source contact 400, the drain contact 500, and the gate contact 600. The heterojunction body 200 is disposed on or above the substrate 100, and the heterojunction body 200 includes the first semiconductor layer 210, the mask layer 220, the regrowth layers 230a and 230b, the second semiconductor layer 240, and the third semiconductor layer 250. The first semiconductor layer 210 is disposed on or above the substrate 100. The first semiconductor layer 210 has two recesses 212a and 212b, and portions of the regrowth layers 230a and 230b are disposed in the recesses 212a and 212b, respectively. The mask layer 220 is disposed above the portion of the first semiconductor layer 210. The third semiconductor layer 250 is disposed between the first semiconductor layer 210 and the mask layer 220. The regrowth layers 230a and 230b are disposed adjacent to the mask layer 220, respectively. The regrowth layer 230a (230b) includes a main portion 232a (232b) and the inclined portion 234a (234b). The main portion 232a (232b) has a top surface 233a (233b), and the inclined portion 234a (234b) has a top surface 235a (235b). The mask layer 220 has a bottom surface 221 facing the first semiconductor layer 210. The top surface 233a (233b) of the main portion 232a (232b) and the bottom surface 221 of the mask layer 220 are non-coplanar, and the top surface 235a (235b) of the inclined portion 234a (234b) slopes at an angle θ between the top surface 233a (233b) of the main portion 232a (232b) and the bottom surface 221 of the mask layer 220. The second semiconductor layer 240 is disposed on the mask layer 220 and the regrowth layers 230a and 230b. The passivation layer 300 is disposed on the second semiconductor layer 240 and at least above the mask layer 220 and the inclined portions 234a and 234b of the regrowth layers 230a and 230b. The source contact 400 and the drain contact 500 are respectively electrically coupled with the heterojunction body 200. The gate contact 600 is disposed on the passivation layer 300, between the source contact 400 and the drain contact 500, and at least above the inclined portions 234a and 234b of the regrowth layers 230a and 230b. Furthermore, in one or more embodiments, the semiconductor device can further include the buffer layer 700 disposed between the substrate 100 and the heterojunction body 200.

In this embodiment, the second semiconductor layer 240 made of AlGaN and each of the regrowth layers 230a and 230b made of GaN are paired to be a heterostructure, respectively. Therefore, two-dimensional electron gases (2DEGs) 292 appear within the heterojunction body 200 and in the main portions 232a and 232b of the regrowth layers 230a and

230b. Moreover, the third semiconductor layer 250 made of AlGaN and the portion of the first to semiconductor layer 210 made of GaN adjacent to the third semiconductor layer 250 also are paired to be another heterosturcture. Therefore, a two-dimensional electron gas (2DEG) 294 appears within the heterojunction body 200 and in the portion of the first semiconductor layer 210 beneath the third semiconductor layer 250. However, since the 2DEG concentration in the inclined portion 234a (234b) of the regrowth layer 230a (230b) is reduced effectively due to the crystal orientations of the second semiconductor layer 240 and each of the regrowth layers 230a and 230b, the 2DEG 292 is substantially interrupted at the inclined portion 234a (234b) of the regrowth layer 230a (230b) that is below the gate contact 600, and therefore the semiconductor device is normally OFF. Through the application of an appropriate threshold voltage to the gate contact 600, 2DEGs can be restored within the inclined portions 234a and 234b of the regrowth layers 230a and 230b connecting the 2DEGs 292 and 294 rendering the semiconductor device ON.

In one or more embodiments, the angle θ between the top surface 235a (235b) of the inclined portion 234a (234b) and the bottom surface 221 of the mask layer 220 can be used to control the threshold voltage of the semiconductor device. More specifically, the electron concentrations of the 2DEG within the inclined portions 234a and 234b of the regrowth layers 230a and 230b decrease as the angle θ approaches 90 degrees. That is, the threshold voltage of the semiconductor device increases as the angle θ approaches 90 degrees. As such, in one or more embodiments, the angle θ can be about 60 degrees.

In summary, the regrowth layers 230a and 230b are both formed by the epi-growth process rather than the etching process. Therefore, the surface damage caused by the etching process does not exist in the regrowth layers 230a and 230b, resulting a good quality semiconductor device. Moreover, for the regrowth layers 230a and 230b made of GaN, the angle θ formed in the epi-growth process is about 60 degrees, resulting a ready-made inclined surface (i.e. the top surface 235a or 235b) which needs no additional inclined surface formation process. In other word, in the step of forming the regrowth layers 230a and 230b not only can prevent the etching damage, but can directly form the inclined portions 234a and 234b.

The Third Embodiment

Figure 3A:
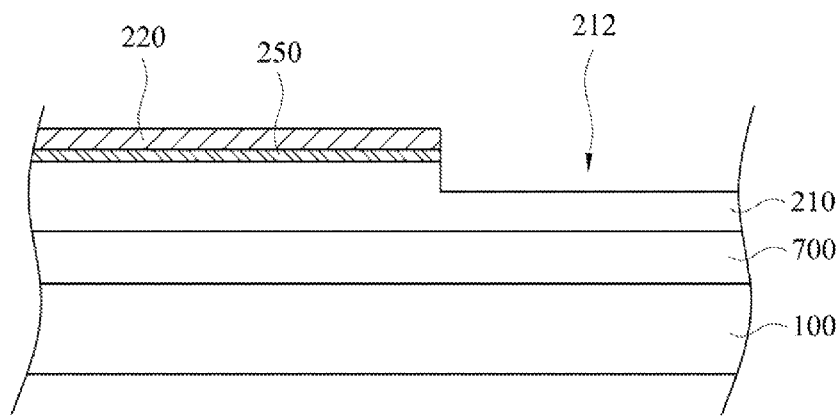
FIG. 3A to FIG. 3E are cross-sectional views of a method for manufacturing the semiconductor device according to a third embodiment of the present invention.

FIG. 3A to FIG. 3E are cross-sectional views of a method for manufacturing a semiconductor device according to the third embodiment of the present invention. As shown in FIG. 3A, a manufacturer may provide a substrate 100 first. Subsequently, the manufacturer may optionally form a buffer layer 700 on the substrate 100. In this embodiment, the substrate 100 may be made of sapphire, Si, SiC, or GaN, and the buffer layer 700 may be made of AlN or other suitable materials.

Then, the manufacturer may form a heterojunction body 200 (see FIG. 3C) on or above the substrate 100. In greater detail, the manufacturer may form a first semiconductor layer 210 on or above the substrate 100 first. For example, in FIG. 3A, the first semiconductor layer 210 is formed above the substrate 100 and on the buffer layer 700. Subsequently, the manufacturer may form a third semiconductor layer 250 on a portion of the first semiconductor layer 210, and then form a mask layer 220 on the third semiconductor layer 250. For example, the manufacturer may form the third semiconductor layer and the mask layer covering overall the surface of the first semiconductor layer 210 in sequence, and then remove a portion of the mask layer, a portion of the third semiconductor layer, and a portion of the first semiconductor layer 210 together by photolithography and etching processes to form the third semiconductor layer 250 on the first semiconductor layer 210, the mask layer 220 on the third semiconductor layer 250, and a recess 212 in the first semiconductor layer 210. In this embodiment, the first semiconductor layer 210 may be made of GaN, the third semiconductor layer 250 may be made of AlGaN, and the mask layer 220 may be made of oxide, nitride, or any combination thereof, such as $SiO_2$.

Figure 3B:
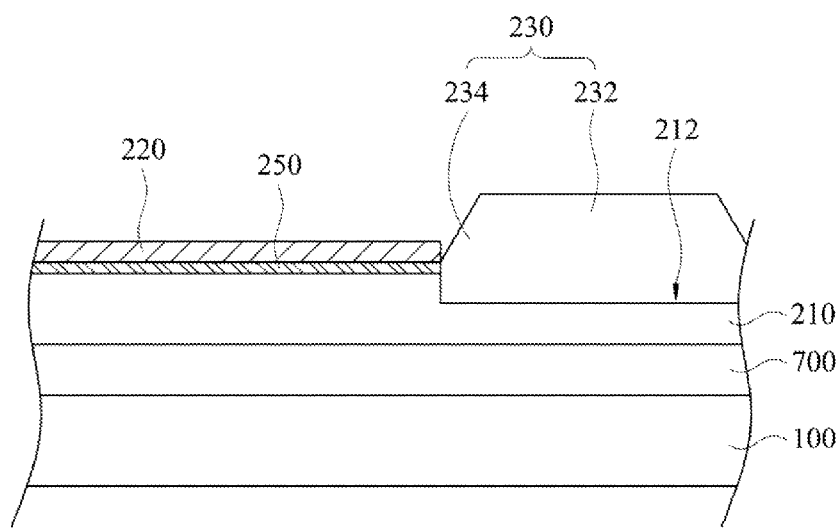

Reference is made to FIG. 3B. The manufacturer may form a regrowth layer 230 on the first semiconductor layer 210 and adjacent to the mask layer 220, where at least a portion of the regrowth layer 230 is disposed in the recess 212. The regrowth layer 230 includes a main portion 232 and at least one inclined portion 234. The regrowth layer 230 may be formed using the epi-growth and high temperature annealing process. After the annealing process, the inclined portion 234 of the regrowth layer 230 can be more precisely formed adjacent to the mask layer 220 since there can be no lateral overgrowth of the regrowth layer 230 during the annealing process. In this embodiment, the material of the regrowth layer 230 may be the same as the material of the first semiconductor layer 210, which means the regrowth layer 230 may be also made of GaN.

Figure 3C:
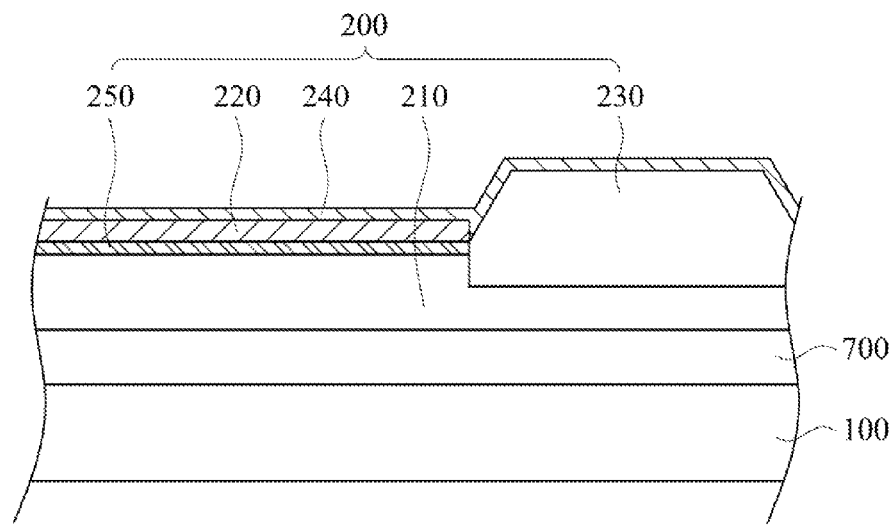

Reference is made to FIG. 3C. The manufacturer then can form a second semiconductor layer 240 on the regrowth layer 230 and the mask layer 220. As such, the step of forming the heterojunction body 200 is completed. In this embodiment, the material of the second semiconductor layer 240 can be the same as the material of the third semiconductor layer 250, which means the second semiconductor layer 240 may be made of AlGaN, and the second semiconductor layer 240 may be formed by epi-growth process.

Figure 3D:
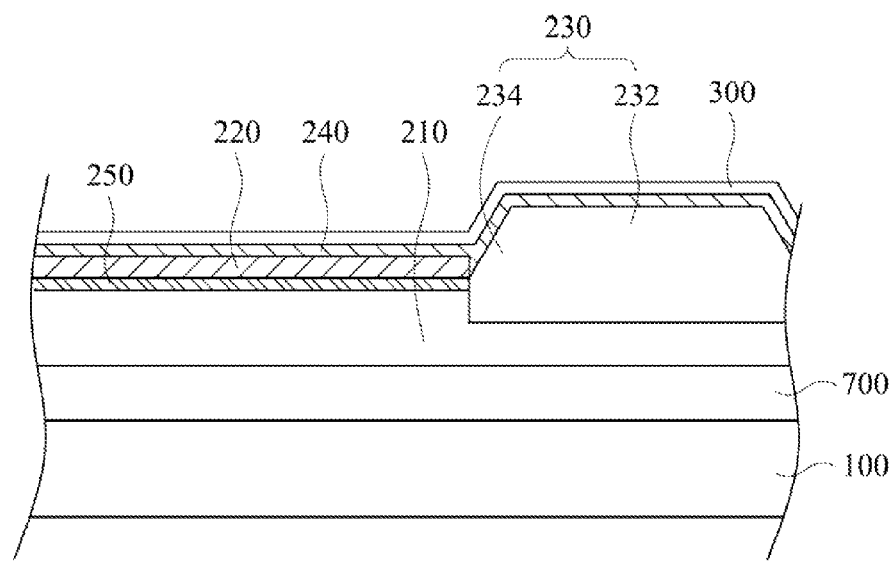

Reference is made to FIG. 3D. The manufacturer may form a passivation layer 300 on the second semiconductor layer 240, and at least above the mask layer 220 and the inclined portion 234 of the regrowth layer 230.

In this embodiment, the passivation layer 300 may be made of $Al_2O_3$, $SiN_x$, $SiO_2$, or any combination thereof.

Figure 3E:
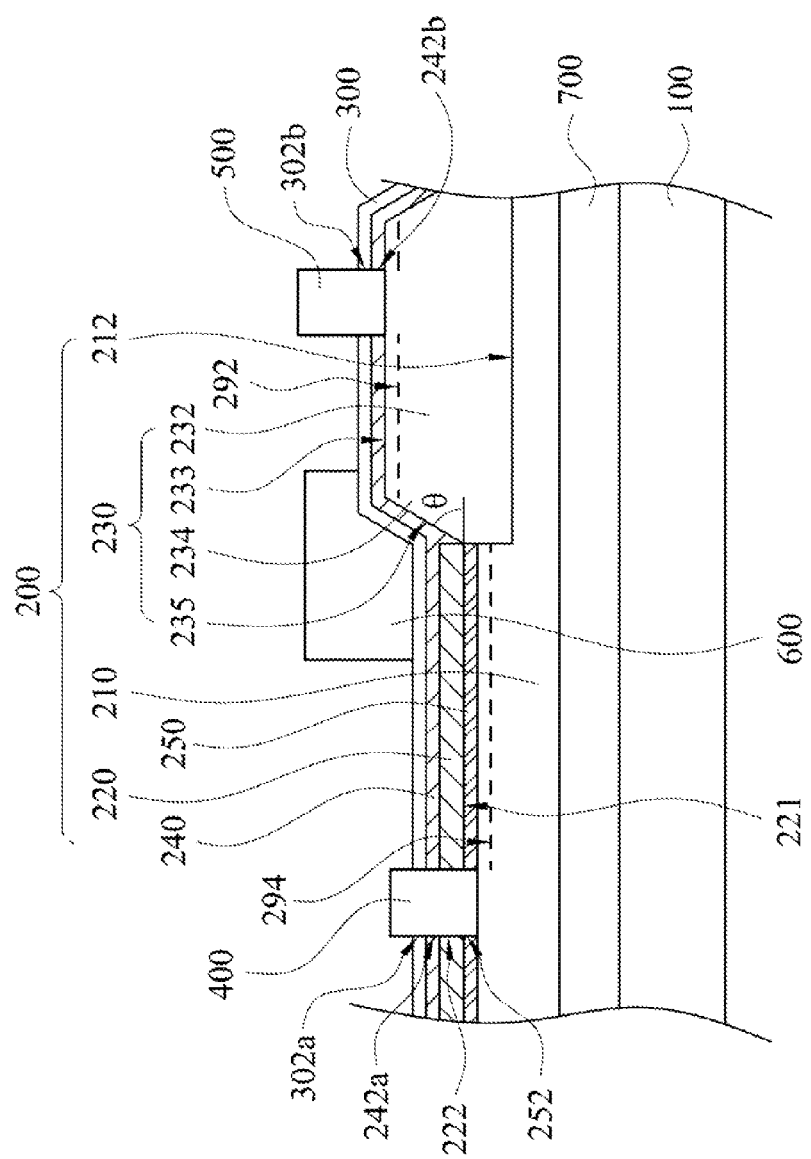

Reference is made to FIG. 3E. Subsequently, the manufacturer may form a source contact 400 and a drain contact 500 respectively electrically coupled with the heterojunction body 200. For example, as shown in FIG. 3E, the manufacturer can form a through hole 252 in the third semiconductor 250 and a through hole 222 in the mask layer 220 to together expose one portion of the first semiconductor layer 210. Furthermore, if the passivation layer 300 and the second semiconductor layer 240 all cover overall the mask layer 220, the manufacturer may also form a through holes 302a in the passivation layer 300, and a through hole 242a in the second semiconductor layer 240, where the through holes 302a, 242a, 252, and 222 together expose the portion of the first semiconductor layer 210. Moreover, the manufacturer can form another through hole 242b in the second semiconductor layer 240 to expose one portion of the regrowth layer 230. Furthermore, if the passivation layer 300 covers overall the second semiconductor layer 240, the manufacturer may also form a through holes 302b in the passivation layer 300, where the through holes 302b and 242b together expose the portion of the regrowth layer 230. Subsequently, the manufacturer may form the source contact 400 on the portion of the first semiconductor layer 210 exposed by the through holes 252, 222, 242a and 302a, and form the drain contact 500 on the portion of the regrowth layer 230 exposed by the through holes 242b and 302b. In this embodiment, the source contact 400 and the drain contact 500 may be made of metal, for example Ti, Al, Ni, Au or any combination thereof.

Subsequently, the manufacturer then may form a gate electrode 600 on the passivation layer 300, between the source contact 400 and the drain contact 500, and at least above the inclined portion 234 of the regrowth layer 230. Consequently, the semiconductor device is completed. In this embodiment, the gate contact 600 may be made of metal, for example Ti, Al, Ni, Au or any combination thereof.

Structurally, the semiconductor device includes the substrate 100, the heterojunction body 200, the passivation layer 300, the source contact 400, the drain contact 500, and the gate contact 600. The heterojunction body 200 is disposed on or above the substrate 100, and the heterojunction body 200 includes the first semiconductor layer 210, the mask layer 220, the regrowth layer 230, the second semiconductor layer 240, and the third semiconductor layer 250. The first semiconductor layer 210 is disposed on or above the substrate 100. The first semiconductor layer 210 has the recess 212, and the portion of the regrowth layer 230 is disposed in the recess 212. The mask layer 220 is disposed above the portion of the first semiconductor layer 210. The third semiconductor layer 250 is disposed between the first semiconductor layer 210 and the mask layer 220. The regrowth layer 230 is disposed adjacent to the mask layer 220. The regrowth layer 230 includes the main portion 232 and the inclined portion 234. The main portion 232 has a top surface 233, and the inclined portion 234 has a top surface 235. The mask layer 220 has a bottom surface 221 facing the first semiconductor layer 210. The top surface 233 of the main portion 232 and the bottom surface 221 of the mask layer 220 are non-coplanar, and the top surface 235 of the inclined portion 234 slopes at an angle θ between the top surface 233 of the main portion 232 and the bottom surface 221 of the mask layer 220. The second semiconductor layer 240 is disposed on the mask layer 220 and the regrowth layer 230. The passivation layer 300 is disposed on the second semiconductor layer 240 and at least above the mask layer 220 and the inclined portion 234 of the regrowth layer 230. The source contact 400 and the drain contact 500 are respectively electrically coupled with the heterojunction body 200. The gate contact 600 is disposed on the passivation layer 300, between the source contact 400 and the drain contact 500, and at least above the inclined portion 234 of the regrowth layer 230. Furthermore, in one or more embodiments, the semiconductor device can further include the buffer layer 700 disposed between the substrate 100 and the heterojunction body 200.

In this embodiment, the second semiconductor layer 240 made of AlGaN and the regrowth layer 230 made of GaN are paired to be a heterostructure. Therefore, a two-dimensional electron gas (2DEG) 292 appears within the heterojunction body 200 and in the main portion 232 of the regrowth layer 230. Moreover, the third semiconductor layer 250 made of AlGaN and the portion of the first semiconductor layer 210 made of GaN adjacent to the third semiconductor layer 250 also are paired to be another heterosturcture. Therefore, a two-dimensional electron gas (2DEG) 294 appears within the heterojunction body 200 and in the portion of the first semiconductor layer 210 beneath the third semiconductor layer 250. However, since the 2DEG concentration in the inclined portion 234 of the regrowth layer 230 is reduced effectively due to the crystal orientations of the second semiconductor layer 240 and the regrowth layer 230, the 2DEG 292 is substantially interrupted at the inclined portion 234 of the regrowth layer 230 that is below the gate contact 600, and therefore the semiconductor device is normally OFF. Through the application of an appropriate threshold voltage to the gate contact 600, a 2DEG can be restored within the inclined portion 234 of the regrowth layer 230 connecting the 2DEGs 292 and 294 rendering the semiconductor device ON.

In one or more embodiments, the angle δ between the top surface 235 of the inclined portion 234 and the bottom surface 221 of the mask layer 220 can be used to control the threshold voltage of the semiconductor device. More specifically, the electron concentrations of the 2DEG within the inclined portion 234 of the regrowth layer 230 decrease as the angle θ approaches 90 degrees. That is, the threshold voltage of the semiconductor device increases as the angle θ approaches 90 degrees. As such, in one or more embodiments, the angle θ can be about 60 degrees.

In summary, the regrowth layer 230 is formed using the epi-growth process rather than the etching process. Therefore, the surface damage caused by the etching process does not exist in the regrowth layer 230, resulting a good quality semiconductor device. Moreover, for the regrowth layer 230 made of GaN, the angle θ formed in the epi-growth process is about 60 degrees, resulting a ready-made inclined surface (i.e. the top surface 235) which needs to no additional inclined surface formation process. In other word, in the step of forming the regrowth layer 230 not only can prevent the etching damage, but can directly form the inclined portion 234.

It will be apparent to those skilled in the art that various modifications and variations can be made to the structure of the present invention without is departing from the scope or spirit of the invention. In view of the foregoing, it is intended that the present invention cover modifications and variations of this invention provided they fall within the scope of the following claims.

What is claimed is:

1. A semiconductor device, comprising:
   a substrate;
   a heterojunction body disposed on or above the substrate, the heterojunction body comprising:
   a first semiconductor layer disposed on or above the substrate;
   a mask layer disposed on or above a portion of the first semiconductor layer;
   a regrowth layer disposed on the first semiconductor layer and to adjacent to the mask layer, the regrowth layer comprising a main portion and at least one inclined portion, each of the main portion and the inclined portion having a top surface, wherein the mask layer has a bottom surface facing the first semiconductor layer, the top surface of the main portion and the bottom surface of the mask layer are non-coplanar, and the top surface of the inclined portion slopes at an angle between the top surface of the main portion and the bottom surface of the mask layer; and
   a second semiconductor layer disposed on the mask layer and the regrowth layer,
   a passivation layer disposed on the second semiconductor layer and at least above the mask layer and the inclined portion of the regrowth layer;
   a source contact and a drain contact respectively electrically coupled with the heterojunction body; and
   a gate contact disposed on the passivation layer, between the source contact and the drain contact, and at least above the inclined portion of the regrowth layer.

2. The semiconductor device of claim 1, wherein the mask layer is disposed between two of the regrowth layers, the second semiconductor layer has at least two through holes, each of the regrowth layers has at least one portion exposed by one of the through holes of the second semiconductor layer, and the source contact and the drain contact are respectively disposed on the portions of the regrowth layers exposed by the through holes of the second semiconductor layer.

3. The semiconductor device of claim 2, wherein the mask layer has a width less than about 2 μm.

4. The semiconductor device of claim 2, wherein the heterojunction body further comprises a third semiconductor layer disposed between the mask layer and the first semiconductor layer; and wherein the first semiconductor layer has two recesses, and portions of the regrowth layers are disposed in the recesses, respectively.

5. The semiconductor device of claim 1, wherein the heterojunction body further comprises a third semiconductor layer disposed between the mask layer and the first semiconductor layer; and wherein the first semiconductor layer has at least a recess, and a portion of the regrowth layer is disposed in the recess.

6. The semiconductor device of claim 5, wherein the second semiconductor layer has at least one through hole exposing at least one portion of the regrowth layer, the third semiconductor layer has at least one through hole and the mask layer has at least one through hole together exposing at least one portion of the first semiconductor layer, one of the source contact and the drain contact is disposed on the portion of the first semiconductor layer exposed by the through hole of the third semiconductor layer, and the other one of the source contact and the drain contact is disposed on the portion of the regrowth layer exposed by the through hole of the second semiconductor layer.

7. The semiconductor device of claim 5, wherein a material of the second semiconductor layer is the same as a material of the third semiconductor layer.

8. The semiconductor device of claim 1, further comprising:

a buffer layer disposed between the substrate and the heterojunction body.

9. The semiconductor device of claim 1, wherein the mask layer is made of oxide, nitride, or any combination thereof.

10. The semiconductor device of claim 1, wherein the angle between the top surface of the inclined portion and the bottom surface of the mask layer is about 60 degrees.

11. The semiconductor device of claim 1, wherein a material of the regrowth layer is the same as a material of the first semiconductor layer.

* * * * *